US009336982B2

(12) United States Patent
Zeidler et al.

(10) Patent No.: US 9,336,982 B2
(45) Date of Patent: May 10, 2016

(54) METHOD OF DETECTING ELECTRONS, AN ELECTRON-DETECTOR AND AN INSPECTION SYSTEM

(71) Applicant: Carl Zeiss Microscopy GmbH, Jena (DE)

(72) Inventors: Dirk Zeidler, Oberkochen (DE); Jörg Jacobi, Aalen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 14/498,290

(22) Filed: Sep. 26, 2014

(65) Prior Publication Data
US 2015/0083911 A1    Mar. 26, 2015

(30) Foreign Application Priority Data

Sep. 26, 2013   (DE) .......................... 10 2013 016 113

(51) Int. Cl.
| | |
|---|---|
| H01J 37/26 | (2006.01) |
| H01J 37/244 | (2006.01) |
| H01J 37/22 | (2006.01) |
| H01J 37/28 | (2006.01) |
| H01J 37/285 | (2006.01) |

(52) U.S. Cl.
CPC ............ *H01J 37/244* (2013.01); *H01J 37/226* (2013.01); *H01J 37/28* (2013.01); *H01J 37/285* (2013.01); *H01J 2237/15* (2013.01); *H01J 2237/2443* (2013.01); *H01J 2237/24507* (2013.01); *H01J 2237/2857* (2013.01)

(58) Field of Classification Search
USPC ............. 250/396 R, 397, 305, 306, 307, 309, 250/310, 311, 492.1, 492.3
See application file for complete search history.

(56) References Cited

U.S. PATENT DOCUMENTS

| | | | |
|---|---|---|---|
| 4,760,265 A | 7/1988 | Yoshida et al. | |
| 5,892,224 A | 4/1999 | Nakasuji | |

(Continued)

FOREIGN PATENT DOCUMENTS

| | | |
|---|---|---|
| DE | 102010011898 A1 | 9/2011 |
| WO | WO 2005/024881 A2 | 3/2005 |

(Continued)

OTHER PUBLICATIONS

German Office Action, with translation thereof, for corresponding DE application No. 10 2013 016 113.4, dated Jul. 21, 2014.

*Primary Examiner* — Nicole Ippolito
(74) *Attorney, Agent, or Firm* — Alston & Bird LLP

(57) ABSTRACT

An electron-detector comprises a scintillator plate 207, electron optics 204 for directing a plurality of electron beams 9 onto the scintillator plate so that the electron beams are incident onto the scintillator plate at locations of incidence disposed at a distance from each other, a light detector 237 comprising a plurality of light receiving areas 235 disposed at a distance from each other, and light optics for generating a first light-optical image of at least a portion of the scintillator plate at a region 243 where the light receiving areas of the light detector are disposed so that, by the imaging, each of the locations of incidence is associated with a light receiving area; and wherein the electron optics comprise an electron beam deflector 255 for displacing the locations of incidence of the electron beams on the scintillator plate in a direction orthogonal to a normal 249 of a surface 208 of the scintillator plate.

24 Claims, 2 Drawing Sheets

(56) References Cited

U.S. PATENT DOCUMENTS

| | | |
|---|---|---|
| 7,385,197 B2 | 6/2008 | Nakasuji et al. |
| 2004/0159787 A1* | 8/2004 | Nakasuji ............ H01J 37/28 250/311 |
| 2006/0289804 A1 | 12/2006 | Knippelmeyer et al. |
| 2007/0228274 A1* | 10/2007 | Elyasaf ............ G01N 23/2251 250/306 |
| 2009/0114818 A1 | 5/2009 | Casares et al. |
| 2009/0159810 A1 | 6/2009 | Knippelmeyer et al. |
| 2009/0256075 A1 | 10/2009 | Kemen et al. |
| 2010/0320382 A1 | 12/2010 | Almogy et al. |
| 2011/0226949 A1 | 9/2011 | Zeidler et al. |
| 2013/0032729 A1 | 2/2013 | Knippelmeyer |
| 2013/0187046 A1 | 7/2013 | Zeidler et al. |
| 2014/0197322 A1 | 7/2014 | Eder et al. |
| 2014/0224985 A1 | 8/2014 | Rodgers et al. |

FOREIGN PATENT DOCUMENTS

| | | |
|---|---|---|
| WO | WO 2007/028595 A2 | 3/2007 |
| WO | WO 2007/028596 A1 | 3/2007 |
| WO | WO 2007/060017 A1 | 5/2007 |
| WO | WO 2007/060017 A2 | 5/2007 |
| WO | WO 2008/101714 A2 | 8/2008 |
| WO | WO 2011/124352 A1 | 10/2011 |
| WO | WO 2012/041464 A1 | 4/2012 |
| WO | WO 2012/112894 A2 | 8/2012 |
| WO | WO 2012/151288 A1 | 11/2012 |
| WO | WO 2013/032949 A1 | 3/2013 |

* cited by examiner

METHOD OF DETECTING ELECTRONS, AN ELECTRON-DETECTOR AND AN INSPECTION SYSTEM

CROSS-REFERENCES TO RELATED APPLICATIONS

The present application claims priority of Patent Application No. 10 2013 016 113.4, filed Sep. 26, 2013 in Germany, the entire contents of which are incorporated by reference herein.

FIELD

The invention relates to a method of detecting electrons, an electron detector and an inspection system. In particular, the invention relates to a method of detecting a plurality of electron beams, an electron-detector and a multi-beam inspection system detecting intensities of a plurality of electron beams.

From WO 2005/024881, an inspection system is known in which a plurality of beams of charged particles are directed onto an object. The system is an electron microscope in which a plurality of primary electron beams are focused parallel to each other in order to form an array of foci on the object. Electrons emerging from the object due to the charged particles incident onto the foci are formed by electron optics to a respective array of electron beams furnished to an electron-detector being configured to generate detection signals representing the intensities of the electron beams of the individual object points. These detector signals are representative for properties of the object at the locations where the foci of the incident charged particles are formed.

By scanning the surface of the object using the array of foci, it is possible to obtain a microscopic image of the object.

BACKGROUND

A conventional electron-detector comprises a scintillator plate having a scintillator material wherein the electron beams, the intensities of which are to be detected, are directed onto the scintillator plate. This scintillator material emits light beams caused by incident electrons. Light optics are provided in order to image this scintillator plate into a region where light receiving areas of a light detector are provided. By detecting light incident onto the light receiving areas, it is possible to deduce the intensities of the electron beams directed onto the scintillator plate.

It has been shown that the light intensities detected by the light detector are unexpectedly low, in particular after a longer period of operation of the electron-detector.

The present invention has been made taking the above considerations into account.

SUMMARY

Some embodiments of the invention provide a method of detecting a plurality of electron beams, an electron-detector and a multi-beam inspection system which detect light generated by incident electrons in a scintillator material at a comparatively high efficiency.

According to some embodiments, a method of detecting a plurality of electron beams comprises directing a plurality of electron beams onto a scintillator plate using electron optics so that the electron beams are incident onto the scintillator plate at a plurality of locations of incidence disposed at a distance from each other, imaging the locations of incidence onto a plurality of light receiving areas of a light detector using light optics so that, by the imaging, each of the locations of incidence is associated with one of the light receiving areas, detecting the light incident onto the light receiving areas, and displacing the locations of incidence, where the electron beams are incident onto the scintillator plate, in a direction orthogonal to a normal of a surface of the scintillator plate.

The inventors found out that this scintillator plate suffers a loss of quality due to the incident electron beams at increasing time of operation and, then, the incident electrons are converted into light beams at a lower efficiency. This loss of quality of the scintillator plate may, for example, be caused by a loss of quality of the scintillator material itself or a deposition of residual gas incurred by incident electron beams at the scintillator plate. However, the electron beams are incident onto the scintillator plate at a distance from each other so that only a small portion of the available area of the scintillator plate is used for detecting electron beams. By the displacing of the locations of incidence of the electron beams on the scintillator plate relative to the scintillator plate, over time, a larger ratio of the available area is used for the detecting the electron beams resulting in less deterioration of the quality of the scintillator plate in dependence of time.

The displacing of the locations of incidence relative to the scintillator plate may, for example, amount to more than 0.01 mm per hour time of operation and, in particular more than 0.1 mm per hour time of operation.

An amount of the displacement of the location of incidence of each of the electron beams on the scintillator plate may, for example, be grater than 0.1 times a minimum distance between adjacent locations of incidence of the plurality of electron beams on the scintillator plate. The displacing may occur stepwise or continuously.

According to some exemplary embodiments, the displacing of the locations of incidence relative to the scintillator plate is performed by moving the scintillator plate relative to components of the electron optics.

An electron-detector suitable for this may then comprise a scintillator plate having a scintillator material, electron optics configured to direct a plurality of electron beams onto the scintillator plate so that the plurality of electron beams is incident onto the scintillator plate at a plurality of locations of incidence disposed at a distance from each other, a light detector comprising a plurality of light receiving areas disposed at a distance from each other, light optics configured to generate, in a region where the light receiving areas of the light detector are disposed, a first light-optical image of at least a portion of the scintillator plate so that, by the imaging, each of the locations of incidence is associated with one of the light receiving areas, and an actuator configured to displace the scintillator plate relative to the light optics in a direction orthogonal to a normal of a surface of the scintillator plate.

According to further exemplary embodiments, the displacing of the locations of incidence relative to the scintillator plate is performed by deflecting the plurality of electron beams prior to their impinging onto the scintillator plate by the electron optics.

An electron-detector suitable for this may comprise a scintillator plate having a scintillator material, electron optics configured to direct a plurality of electron beams onto the scintillator plate so that the plurality of electron beams is incident onto the scintillator plate at a plurality of locations of incidence disposed at a distance from each other, a light detector comprising a plurality of light receiving areas disposed at a distance from each other, and light optics configured to generate, in a region where the light receiving areas of the light detector are disposed, a first light-optical image of at least a portion of the scintillator plate so that, by the imaging, each of the locations of incidence is associated with one of the light receiving areas, and wherein the electron optics comprise an electron beam deflector configured to displace the locations of incidence of the electron beams on the scintillator plate in a direction orthogonal to a normal of a surface of the scintillator plate.

By the deflecting of the electron beams prior to their impinging onto the scintillator plate, the locations of incidence are also displaced relative to the light optics so that, in certain cases, the light emerging from the respective locations of incidence may eventually not be incident onto the light receiving area associated with the respective location of incidence and, accordingly, not be detected appropriately. Therefore, some embodiments provide a compensation of the displaced locations of incidence by measures provided by the light optics or the light detector.

According to some exemplary embodiments, the method then comprises displacing the light receiving areas of the light detector relative to the light optics so that light emerging from each of the displaced locations of incidence is incident onto the light receiving area associated with the respective location of incidence.

An electron-detector suitable for this may then further comprise an actuator configured to displace the light receiving areas relative to the light optics.

According to further exemplary embodiments, the method further comprises displacing a least one component of the light optics relative to the scintillator plate so that light emerging from each of the displaced locations of incidence is incident onto the light receiving area associated with the respective location of incidence.

An electron-detector suitable for this may then further comprise an actuator configured to displace a component of the light optics relative to the scintillator plate.

According to some exemplary embodiments herein, the at least one displaceable component of the light optics comprises a light beam deflector or a lens, the component being displaceable in order to vary a location of the first light-optical image of the scintillator plate in the region of the light receiving areas of the light detector. The light deflector may, for example, be a mirror deflectable by the actuator.

According to some exemplary embodiments, the electron beams are focussed by the electron optics onto the scintillator plate. By this, particularly small areas illuminated by the electron beams on the scintillator plate exist onto which a high intensity of electrons per unit area is then incident. This may cause a quick local deterioration of the quality of the scintillator plate causing, however, merely a small disadvantage as the locations of incidence are displaced relative to the scintillator plate and, therefore, the scintillator material of the scintillator plate is used evenly for the detecting of electron beams.

According to some exemplary embodiments, the electron-detector comprises a controller configured to control the electron beam deflector and the actuator so that light emerging from each of the displaced locations of incidence is incident onto the light receiving area associated with the respective location of incidence. By commonly controlling of the electron beam deflector and the actuator, the displacing of the locations of incidence on the scintillator plate is compensated so that the light emerging from each of the locations of incidence is incident onto the light receiving area associated with the respective location of incidence due to the imaging of the light optics.

According to further exemplary embodiments, an electron-detector further comprises a light-optical camera wherein the light optics are further configured so that a second light-optical image of the portion of the scintillator plate is detectable by the light-optical camera.

The images of the locations of incidence of the electron beams are perceptible on the image detected by the light-optical camera. By analyzing the image, it is possible to determine the position of the locations of incidence of the electron beams on the scintillator plate relative to the scintillator plate.

According to further exemplary embodiments herein, the controller is configured to control the actuator depending on the image detected by the light-optical camera. In particular, the actuator may be controlled so that the images of the locations of incidence of the electron beams always remain at the same positions in the detected image. Then, it is expected that the light emerging from the locations of incidence are also always incident onto the light receiving areas associated with the respective locations of incidence due to the imaging of the light optics.

According to further exemplary embodiments herein, the light optics further comprise a light-optical beam splitter disposed in a beam path between the scintillator plate and the region where the light receiving areas of the light detector are disposed and a beam path between the scintillator plate and the light-optical camera.

Some embodiments further provide a multi-beam inspection system comprising a particle beam source configured to generate a plurality of particle beams, particle optics configured to direct the plurality of particle beams onto an object plane, an electron-detector of the aforementioned elucidated kind wherein the electron optics are configured to direct electrons emerging from the locations of incidence of the plurality of particle beams on the object plane as the plurality of electron beams onto the scintillator plate.

BRIEF DESCRIPTION OF THE DRAWINGS

The forgoing as well as other advantageous features of the disclosure will be more apparent from the following detailed description of exemplary embodiments with reference to the accompanying drawings. It is noted that not all possible embodiments necessarily exhibit each and every, or any, of the advantages identified herein.

Some embodiments are subsequently elucidated with reference to drawings.

DETAILED DESCRIPTION OF EXEMPLARY EMBODIMENTS

Figure 1:
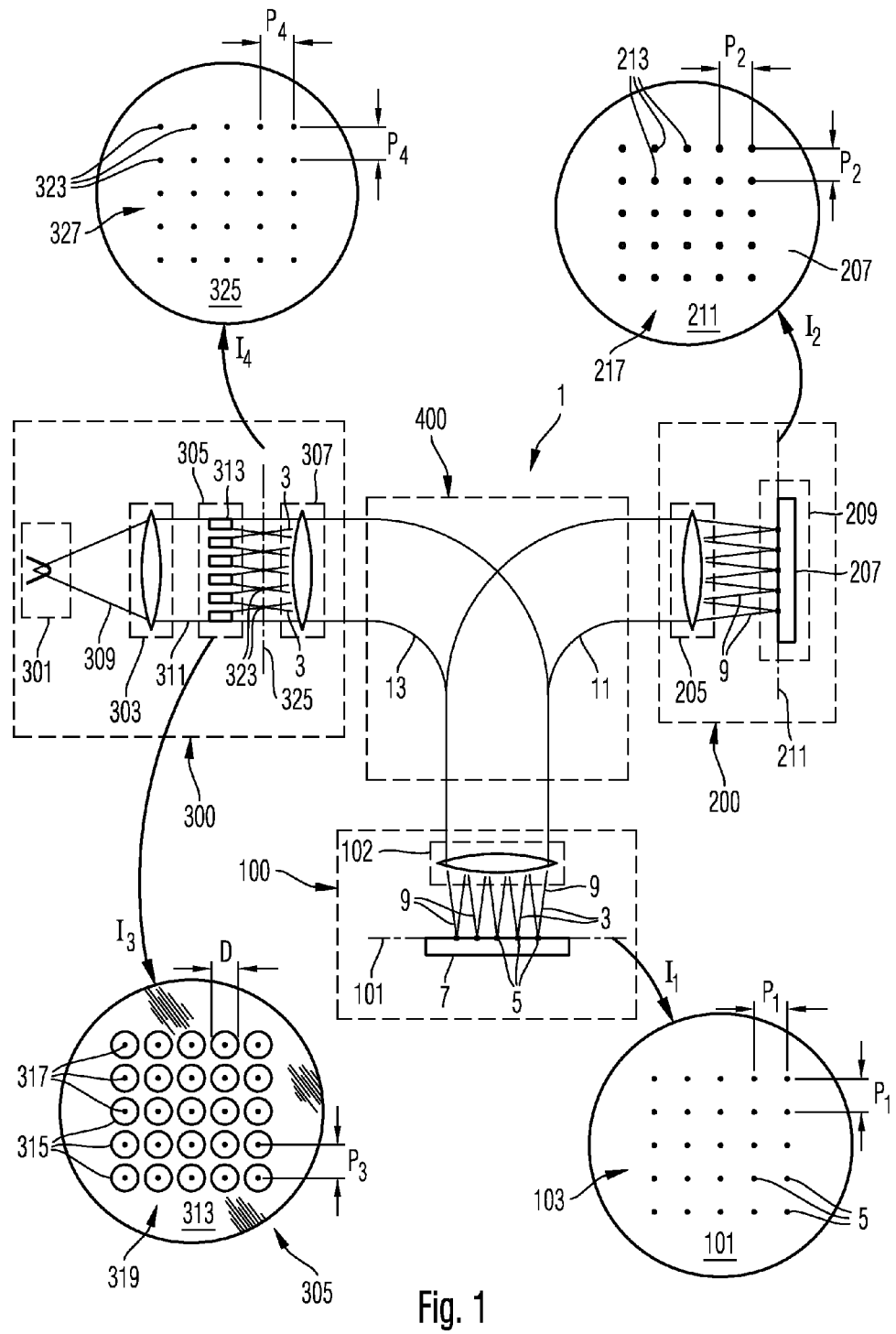
FIG. 1 shows a multi-beam inspection system.

In the exemplary embodiments described below, components that are alike in function and structure are designated as far as possible by alike reference numerals. Therefore, to understand the features of the individual components of a specific embodiment, the descriptions of other embodiments and of the summary of the disclosure should be referred to.

FIG. 1 is a schematic illustration of a multi-beam inspection system using a plurality of beams of charged particles. The inspection system generates a plurality of beams of charged particles incident onto an object to be analyzed in order to there generate electrons emitted from the object and subsequently being detected. The inspection system 1 is a type of scanning electron microscope (SEM) using a plurality of primary electron beams 3 in order to generate a plurality of electron beam spots 5 on a surface of the object 7. The object to be analyzed 7 may be of any kind and comprise, for example, a semiconductor wafer, a biological tissue and an assembly of miniaturized elements or the same. The surface of the object 7 is disposed in an object plane 101 of the objective lens 102 of an objective lens system 100.

The magnified section $I_1$ of FIG. 1 shows a top view onto the object plane 101 having a periodic right-angled array 103 of beam spots 5 formed in the plane 101. In FIG. 1, the number of beam spots amounts to 25 disposed as a 5×5 array 103. The amount 25 of beam spots is a small number chosen in due course of a simplified illustration. In practice, the amount of beam spots may be substantially larger, for example, 20×30, 100×100 and the like.

In the illustrated embodiment, the array 103 of beam spots 5 is an essentially periodic right-angled array having a constant distance P1 between adjacent beam spots. Exemplary values of the distance P1 are 1 µm and 10 µm. However, it is also possible that the array 103 has different symmetries, for example, a hexagonal symmetry.

A diameter of the beam spots formed in the object plane 101 may be small. Exemplary values of said diameters amount to 5 nm, 100 nm and 200 nm. The focusing of the particle beams 3 for forming the beam spots 5 is performed by the objective lens system 100.

The particles incident onto the object cause electrons emerging from the surface of the object 7. The electrons emerging from the surface of the object 7 are formed to electron beams 9 by the objective lens 102. The inspection system 1 provides an electron beam path 11 in order to guide the plurality of electron beams 9 to a detection system 200. The detection system 200 comprises electron optics having a projection lens assembly 205 for directing the electron beams 9 onto an electron-detector 209. The electron-detector 209 comprises a scintillator plate 207 having a scintillator material which emits light when electrons are incident onto the scintillator material. This light is detected as described below in detail.

The section $I_2$ in FIG. 1 shows a top view onto the surface of the scintillator plate 207 onto which the electron beams 9 are incident at locations 213. The locations of incidence 213 are disposed in an array 217 having a periodic distance P2. Exemplary values of the distance P2 are 10 µm, 100 µm and 200 µm.

The primary electron beams 3 are generated in a beam generating apparatus 300 comprising at least one electron source 301, at least one collimator lens 303, a multi-aperture assembly 305 and a field lens 307. The electron source 301 generates a diverging electron beam 309 collimated by the collimator lens 303 in order to form a beam 311 illuminating the multi-aperture assembly 305.

The section $I_3$ in FIG. 1 shows a top view onto the multi-aperture assembly 305. The multi-aperture assembly 305 comprises a multi-aperture plate 313 comprising a plurality of openings and apertures 315 formed therein, respectively. Centers 317 of the openings 315 are disposed in a pattern 319 corresponding to the pattern 103 formed by the beam spots 5 in the objective plane 101. A distance P3 of the centers 317 of the apertures 315 with respect to each other may have values of, for example, 5 µm, 100 µm and 200 µm. The diameter D of the apertures 315 are smaller than the distance P3 of the centers of the apertures. Exemplary values of the diameters D are 0.2×P3, 0.4×P3 and 0.8×P3.

Electrons of the illuminating beam 311 traverse the apertures 315 and form electron beams 3. Electrons of the illuminating beam 311 hitting the plate 313 are absorbed and do not contribute to the forming of the electron beams 3.

The multi-aperture assembly 305 focuses the electron beams 3 so that beam foci 323 are formed in a plane 325. The section $I_4$ in FIG. 1 shows a top view onto the plane 325 comprising the foci 323 disposed in a pattern 327. A distance P4 of the foci 323 of the pattern 327 may be equal to the distance P3 in the pattern 319 of the multi-aperture plate 313 or be different to it. A diameter of the foci 323 may amount to, for example, 10 nm, 100 nm and 1 µm.

The field lens 307 and the objective lens 102 provide an imaging system for imaging the plane 325 in which the foci are formed onto the object plane 101 so that an array 103 of beam spots 5 is formed on the surface of the object 7.

A beam switch 400 is provided in the beam path between the multi-aperture assembly 305 and the objective lens system 100. The beam switch 400 is also part of the beam path 11 between the objective lens system 100 and the detection system 200.

Further information relating to multi-beam inspection systems of this kind and therein used components such as particle sources, multi-aperture plates and lenses may be obtained from the patent applications WO 2005/024881, WO 2007/028595, WO 2007/028596 and WO 2007/060017, the disclosure of which is incorporated by reference herein.

Figure 2:
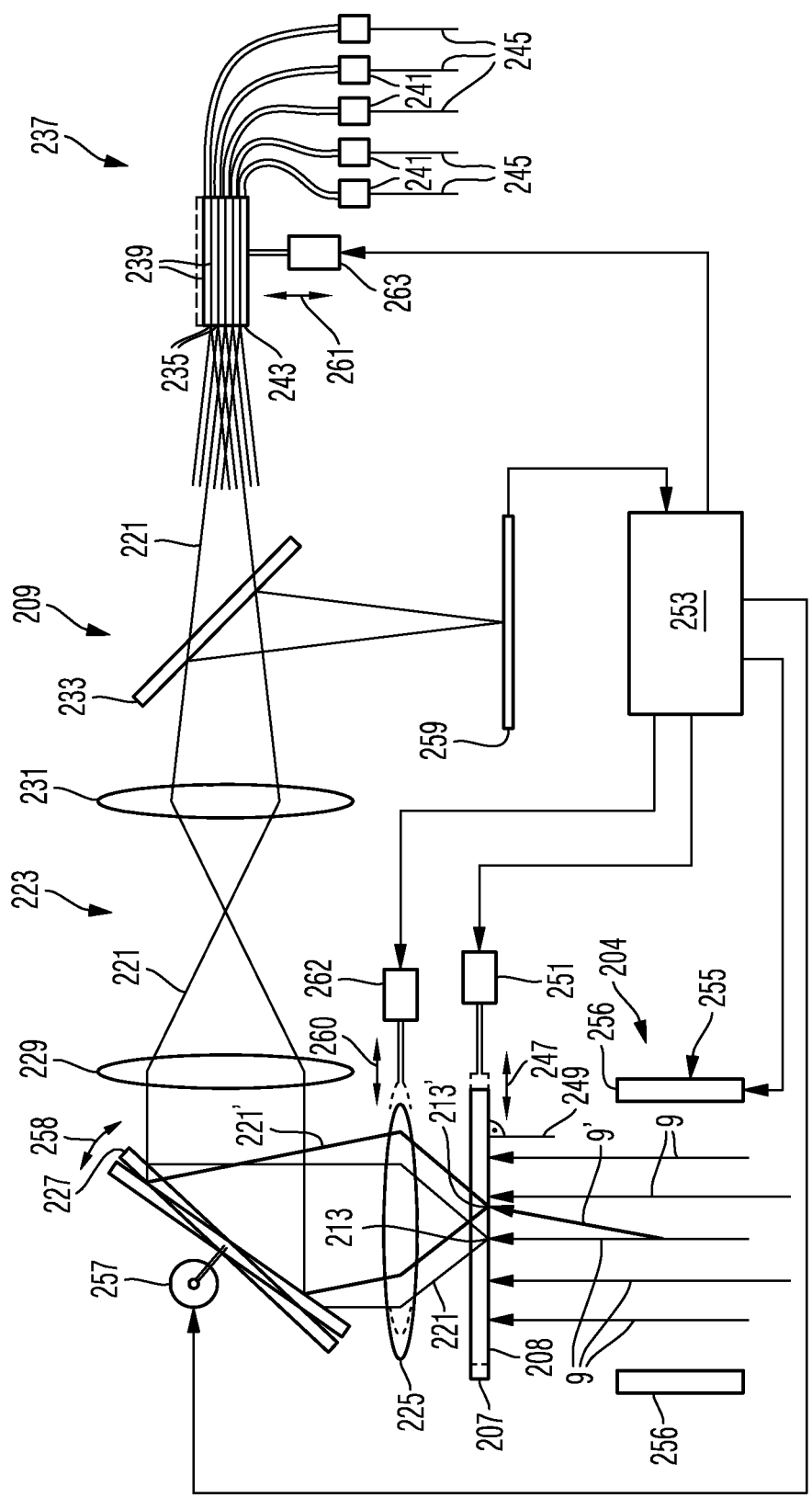
FIG. 2 shows an electron-detector as it may be used for the multi-beam inspection system of FIG. 1.

FIG. 2 is a schematic illustration for illustrating multiple details of the electron-detector 209. The electron-detector 209 comprises a scintillator plate 207 onto which the electron beams are directed by electron optics 204. The electron optics 204 comprise, when integrated in the multi-beam inspection system of FIG. 1, electron-optical components forming the electron beams 9, i.e., for example the objective lens 102 guiding the electron beams towards the electron-detector, the beam switch 400 and components focusing the electron beams 9 onto the surface of the scintillator plate 207, such as the lens 205. The electron beams 9 are incident onto the scintillator plate 207 at locations of incidence 213. Also if the electron beams 9 are focused onto the surface of the scintillator plate 207, beam spots are formed on the surface, the diameter of which cannot be arbitrarily small. The centers of the beam spots may be considered as the locations of incidence 213 disposed from each other at the distance P2 (see FIG. 1).

The scintillator plate 207 comprises a scintillator material emitting light beams when excited by the incident electrons of the electron beams 9. Therefore, at each of the locations of incidence 213 a source of light beams is disposed. In FIG. 2, only a single such light beam 221 is shown emitted from the location of incidence 213 of the middle one of the five depicted electron beams 9. The light beam 221 propagates through light optics 223 comprising a first lens 225, a mirror 227, a second lens 229, a third lens 231 and a beam splitter 233 and is then incident onto a light receiving area 235 of a light detector 237. The light receiving area 235 is formed by a front side of a glass fiber 239 into which at least a portion of the light beam 221 is coupled and guided to a light detector 241. The light detector may comprise, for example, a photo multiplier, an avalanche-photodiode, a photodiode or other kinds of suitable light detectors. The light optics 223 are configured so that it optically images the surface 208 of the scintillator plate 207 into a region 243 where the light receiving area 235 is disposed. Due to this optical imaging optical images of the locations of incidence 213 are formed in the region 243. For each of the locations of incidence 213 a separate light receiving area 235 of the light detector 237 is provided in the region 243. Each of the further light receiving areas 235 is formed by a front side of a light guide 239 guiding the light coupled into the front side to a light detector 241. Due to the optical imaging each of the locations of incidence 213 is associated with a light receiving area 235 wherein the light incident onto each of the light receiving areas 235 is detected by a separate light detector 241. The light detectors 241 output detection signals via electric signal lines 245. The detection signals represent intensities of the electron beams 9.

In the embodiment elucidated herein, the light detectors are disposed at a distance from the light receiving areas onto which the light optics image the scintillator plate and the received light is guided to the light detectors by glass fibers. However, it is also possible that the light detectors are directly disposed where the light optics generate the image of the scintillator plate and the light sensitive areas are thus formed by the light receiving areas.

The electron beams 9 propagate in a vacuum and also the surface 208 of the scintillator plate 207 is disposed in the vacuum. The light optics 223 may be disposed outside the vacuum wherein, then, a vacuum window is provided in the beam path of the light beam 221 being traversed by the beam 221 and separates the vacuum from the environment.

The electron beams incident onto the scintillator plate 207 may ionize residual gas molecules in the region in front of the scintillator plate resulting in electric charges at the locations of incidence 213 and the charges may, in turn, attract residual gaseous contaminant in the vacuum so that the contaminant is deposited at the locations of incidence 213 on the scintillator plate 207 and result in the deterioration of the properties of the scintillator material so that the intensity of the light beams 221 caused by the incident electron beams 9 decreases over time. This problem can be coped with by displacing the locations of incidence 213 in a direction 247 orthogonal to a surface normal 249 of the scintillator plate, the direction being oriented orthogonal to a normal 249 of a surface 208 of the scintillator plate 207. With this, the electron beams 9 are not always incident onto the surface 208 of the scintillator plate at the same locations of incidence 213 but are moved over the surface 208 of the scintillator plate 207 and, therefore, moved to ever new locations on the surface 208. A contamination occurring at distinct locations on the surface 208 of the scintillator plate 207 then does not hinder the generating of light at the locations of incidence 213 caused by the incident electron beams 9.

There are several possibilities for displacing the locations of incidence 213 relative to the scintillator plate 207. Some of these several possibilities are illustrated in FIG. 2. However, it is not necessary to provide all possibilities for displacing the locations of incidence 213 relative to the scintillator plate 207 illustrated in FIG. 2 in practice. It is sufficient to provide, for example, only a single one of these possibilities.

One of the possibilities for displacing the locations of incidence 213 relative to the scintillator plate 207 is to displace the scintillator plate 207 itself in the direction 247. For this, an actuator 251 is provided coupled to the scintillator plate 207 in order to move it in the direction 247. Two positions of the scintillator plate 207 are shown in FIG. 2, namely one illustrated with solid lines and one illustrated with dashed lines. The actuator 251 is controlled by a controller 253 controlling the actuator 251 in order to generate a movement of the scintillator plate 207 relative to components of the electron optics 204 in the direction 247. This movement may be performed, for example, continuously or stepwise. A velocity of the movement may amount to, for example, 0.01 mm per hour time of operation up to 0.1 mm per hour time of operation or more. The movement may have an amount and a stroke, respectively, being greater than 0.1 times the distance P2 of the locations of incidence 213 of the electron beams 9 with respect to each other.

When the scintillator plate 207 is moved relative to the components of the electron optics 204, the position of the locations of incidence 213 relative to the electron optics 204 and relative to the light optics 223 is not changed so that the light optics 223 still image the locations of incidence 213 into the region 243 where the light receiving areas 235 of the associated light detectors 237 are disposed so that the intensities of the electron beams 9 may be detected by the light detector 237 using the unchanged light optics 223.

Another possibility for displacing the locations of incidence relative to the scintillator plate 207 is to deflect the electron beams prior to their impinging onto the scintillator plate 207. For this, the electron optics 204 may comprise a beam deflector 255 commonly deflecting the electron beams 9. The beam deflector 255 may comprise, for example, two electrodes 256 disposed on both sides of the bundle of electron beams 9 and having suitable deflection voltages applied to them by the controller 253.

The beam deflector 255 deflects all electron beams 9 simultaneously so that the locations of incidence 213 are displaced relative to scintillator plate 207. In FIG. 2, the deflection of the middle electron beam 9 is illustrated as an example by an arrow 9'. The deflected electron beam 9' is incident onto a displaced location of incidence 213' on the surface 208 of the scintillator plate 207 and a light beam 221' emerges from the displaced location of incidence 213, the light beam 221' being displaced relative to the illustrated light beam 221 emerging from the non-displaced location of incidence 213 of the middle electron beam 9. Using unchanged imaging optics 223 the displaced location of incidence 213' is however not necessarily imaged onto the light receiving area 235 associated with the middle electron beam 9. Therefore, it is necessary to compensate for the displacement of the location of incidence 213' relative to the light optics 223. For this, again, several possibilities exist.

A possibility is to design the mirror 227 as a pivoting mirror which can be pivoted using an actuator 257 as indicated by an arrow 258. The actuator 257 is controlled by the controller 253 so that the displaced light beam 221' is reflected at the pivoting mirror 227 so that the beam essentially coincides with the beam path of the non-displaced light beam 221 and the light emerging from the displaced location of incidence 213' is again incident onto the light receiving area 235 associated with the middle electron beam 9. This deflection of the light beam 221' by the pivoting mirror 227 is performed for all of the light beams emerging from the plurality of locations of incidence 213 so that all of these beams are incident onto their associated light receiving areas 235 and, hence, the intensities of all deflected electron beams 9' can be detected.

The controlling of the actuator by the controller 253 may be performed in dependence of a light-optical image of the surface 208 of the scintillator plate 207. The light-optical image of the scintillator plate 207 is detected by a light-optical camera 259 receiving a portion of the light reflected at the beam splitter 233. The image detected by the camera 259 comprises images of the displaced locations of incidence 213' wherein the controller 253 controls the actuator 257 so that these images are always disposed at the same locations within the image independent of the deflection of the electron beams 9 generated by the controller 253 by controlling the beam deflector 255. Coupling out the image by the beam splitter 233 and its detection by the camera 259 therefore allows for a feed-back control of the actuator 257. However, this feed-back control is optional so that the beam splitter 233 and the camera 259 may be omitted. The deflection of the actuator 257 then to be set by the controller 253 in dependence of the excitations of the beam deflectors 255 generated by the controller 253 may, for example, be determined experimentally in advance and defined and in a table memory.

Besides the actuating of the pivoting mirror 227 for compensating the displacement of the locations of incidence 213', it is also possible to displace one of the lenses 225, 229, 231 of the light optics 223. In FIG. 2, this is shown as an example for the lens 225 being coupled to actuator 262 controlled by the controller 253 so that the actuator 262 displaces the lens 225 in a direction represented by an arrow 260. The displacement of the lens 225 by the actuator 262 has a same effect as the pivoting of the pivoting mirror 227 by the actuator 257 so that the light emerging from the locations of incidence 213 is incident onto the light receiving area 235 of the light detector 237 associated with the respective location of incidence. Also the controlling of the actuator may be performed depending on the optical image of the surface 208 of the scintillator plate 207 detected by the camera 259. Furthermore, it is possible that the light optics 223 do not comprise the deflecting mirror 227 if the lens 225 or any other of the lenses of the light optics 223 is displaced in order to compensate for the displacement of the locations of incidence 213.

Furthermore, it is possible to displace the light receiving areas 235 in a direction 261 to make sure that the light emerging from the displaced locations of incidence 213' is incident onto the light receiving areas 235 independent of the amount of the displacement, the light receiving areas being associated with the respective locations of incidence 213. For this, the front ends of the light guide 239 are displaced as a bundle by an actuator 263 controlled by the controller 253.

In the embodiments the elucidated hereinbefore, the locations of incidence of the electron beams onto the scintillator plate are displaced in a spatial direction orthogonal to the surface normal of the scintillator plate. However, it is also possible to perform the displacement of the locations of incidence in two spatial directions orthogonal to each other. For example, this can be done by configuring the actuator 251 for moving the scintillator plate so that the actuator provides the displacement of the scintillator plate in two spatial directions or the beam deflector 255 for the electron beams may comprise multiple pairs of electrodes 256 disposed in a circumferential direction about the bundle of beams 9 in order to deflect the electron beams in two independent directions. Furthermore, the light beam deflector 227 and its actuator 257 may then be configured so that the light beam deflector is pivotable in two directions or there can be disposed two pivoting mirrors after another in the beam path, the pivoting mirrors each being pivotable in one direction. By changing the locations of incidence in two directions orthogonal to each other, the available area of the scintillator may be exploited even better.

While the disclosure has been described with respect to certain exemplary embodiments thereof, it is evident that many alternatives, modifications and variations will be apparent to those skilled in the art. Accordingly, the exemplary embodiments of the disclosure set forth herein are intended to be illustrative and not limiting in any way. Various changes may be made without departing from the spirit and scope of the present disclosure as defined in the following claims.

What is claimed is:

1. A method of detecting a plurality of electron beams, the method comprising:
    directing a plurality of electron beams onto a scintillator plate using electron optics so that the electron beams are incident onto the scintillator plate at a plurality of locations of incidence disposed at a distance from each other;
    imaging the locations of incidence onto a plurality of light receiving areas of a light detector using light optics so that, by the imaging, each of the locations of incidence is associated with one of the light receiving areas;
    detecting light incident onto the light receiving areas of the light detector; and
    displacing the locations of incidence, where the electron beams are incident onto the scintillator plate, in a direction orthogonal to a normal of a surface of the scintillator plate.

2. The method according to claim 1, wherein the displacing of the locations of incidence, where the electron beams are incident onto the scintillator plate, comprises moving the scintillator plate relative to components of the electron optics.

3. The method according to claim 1, wherein the displacing of the locations of incidence, where the electron beams are incident onto the scintillator plate, comprises deflecting the plurality of electron beams by the electron optics.

4. The method according to claim 3, further comprising:
    displacing the light receiving areas of the light detector relative to the light optics so that light emerging from each of the displaced locations of incidence is incident onto the light receiving area associated with the respective location of incidence.

5. The method according to claim 3, further comprising:
    displacing at least one component of the light optics relative to the scintillator plate so that light emerging from each of the displaced locations of incidence is incident onto the light receiving area associated with the respective location of incidence.

6. The method according to claim 5, wherein the at least one component of the light optics comprise at least one of a mirror disposed in a beam path of the light optics between the scintillator plate and the light receiving areas, and a lens disposed in a beam path of the light optics between the scintillator plate and the light receiving areas.

7. The method according to claim 1, wherein the directing of the plurality of electron beams onto the scintillator plate comprises focusing the electron beams onto the scintillator plate using the electron optics.

8. The method according to claim 1, further comprising:
    directing a plurality of particle beams onto a plurality of locations on the object;
    forming the plurality of electron beams from electrons emerging from the plurality of locations on the object.

9. An electron-detector comprising:
    a scintillator plate having a scintillator material;
    electron optics configured to direct a plurality of electron beams onto the scintillator plate so that the plurality of electron beams is incident onto the scintillator plate at a plurality of locations of incidence disposed at a distance from each other; a light detector comprising a plurality of light receiving areas disposed at a distance from each other; and
    light optics configured to generate, in a region where the light receiving areas of the light detector are disposed, a first light-optical image of at least a portion of the scintillator plate so that, by the imaging, each of the locations of incidence is associated with one of the light receiving areas; and
    wherein the electron optics comprise an electron beam deflector configured to displace the locations of incidence of the electron beams on the scintillator plate in a direction orthogonal to a normal of a surface of the scintillator plate.

10. The electron-detector according to claim 9, further comprising an actuator configured to displace a component of the light optics relative to the scintillator plate.

11. The electron-detector according to claim 10, wherein the displaceable component of the light optics comprises at least one of a light beam deflector and a lens, the component being displaceable in order to vary a location of the first light-optical image of the scintillator plate in the region of the light receiving areas of the light detector.

12. The electron-detector according to claim 9, further comprising an actuator configured to displace the light receiving areas relative to the light optics.

13. The electron-detector according to claim 10, further comprising a controller configured to control the electron beam deflector and the actuator so that light emerging from each of the displaced locations of incidence is incident onto the light receiving area associated with the respective location of incidence.

14. The electron-detector according to claim 13, wherein the controller is further configured to control the electron beam deflector so that each of the locations of incidence of the electron beams on the scintillator plate is scanned along a predetermined path over the scintillator plate.

15. The electron-detector according to claim 13, further comprising a light-optical camera wherein the light optics are further configured so that a second light-optical image of the portion of the scintillator plate is detectable by the light-optical camera.

16. The electron-detector according to claim 15, wherein the controller is further configured to control the actuator in dependence of an image detected by the light-optical camera.

17. The electron-detector according to claim 15, wherein the light optics further comprise a light-optical beam splitter disposed in a beam path between the scintillator plate and the region where the light receiving areas of the light detector are disposed and in a beam path between the scintillator plate and the light-optical camera.

18. The electron-detector according to claim 9, wherein the electron beam deflector is configured to displace the location of incidence of each of the electron beams on the scintillator plate by an amount greater than 0.1 times a minimum distance between adjacent locations of incidence of a majority of electron beams on the scintillator plate.

19. An electron-detector comprising:
a scintillator plate having a scintillator material;
electron optics configured to direct a plurality of electron beams onto the scintillator plate so that the plurality of electron beams is incident onto the scintillator plate at a plurality of locations of incidence disposed at a distance from each other; a light detector comprising a plurality of light receiving areas disposed at a distance from each other;
light optics configured to generate, in a region where the light receiving areas of the light detector are disposed, a first light-optical image of at least a portion of the scintillator plate so that, by the imaging, each of the locations of incidence is associated with one of the light receiving areas; and
an actuator configured to displace the scintillator plate relative to the light optics in a direction orthogonal to a normal of a surface of the scintillator plate.

20. The electron-detector according to claim 19, further comprising a controller configured to control the actuator so that the scintillator plate is moved relative to the light optics during an time of operation of one hour, 10 hours or 24 hours by more than 0.01 mm, more than 0.1 mm or more than 0.2 mm.

21. The electron-detector according to claim 19, wherein the electron optics are further configured to focus each of the plurality of electron beams onto the scintillator plate.

22. A multi-beam inspection system comprising:
a particle beam source configured to generate a plurality of particle beams, particle optics configured to direct the plurality of particle beams onto an object plane;
an electron-detector according to claim 9,
wherein the electron optics are configured to direct electrons emerging from locations of incidence of the plurality of particle beams on the object plane as the plurality of electron beams onto the scintillator plate.

23. The electron-detector according to claim 9, wherein the electron optics are further configured to focus each of the plurality of electron beams onto the scintillator plate.

24. A multi-beam inspection system comprising:
a particle beam source configured to generate a plurality of particle beams, particle optics configured to direct the plurality of particle beams onto an object plane;
an electron-detector according to claim 19,
wherein the electron optics are configured to direct electrons emerging from locations of incidence of the plurality of particle beams on the object plane as the plurality of electron beams onto the scintillator plate.

* * * * *